United States Patent [19]

Schaller et al.

[11] Patent Number: 5,681,663

[45] Date of Patent: Oct. 28, 1997

[54] HEATSPREADER CARRIER STRIP

[75] Inventors: Alfred J. Schaller, Rockledge, Pa.;
Cuong Van Pham, Northville, Mich.

[73] Assignee: Ford Motor Company, Dearborn, Mich.

[21] Appl. No.: 488,699

[22] Filed: Jun. 9, 1995

[51] Int. Cl.⁶ .................................................. H01L 23/495
[52] U.S. Cl. ........................ 428/614; 428/620; 428/676; 428/929; 428/931; 257/677
[58] Field of Search .............................. 428/614, 620, 428/929, 931, 676, 571, 572, 573; 257/675, 669, 677, 720

[56] References Cited

U.S. PATENT DOCUMENTS

| | | | |
|---|---|---|---|
| 3,134,701 | 5/1964 | Evans et al. | 428/931 |
| 4,283,464 | 8/1981 | Hascoe | 257/720 |
| 4,320,412 | 3/1982 | Hynes et al. | 357/70 |
| 4,980,245 | 12/1990 | Marino | 428/929 |
| 4,996,115 | 2/1991 | Eerkes et al. | 428/931 |
| 5,156,923 | 10/1992 | Jha et al. | 428/614 |
| 5,288,667 | 2/1994 | Taruya et al. | 437/207 |
| 5,358,795 | 10/1994 | Nakamura et al. | 428/620 |

FOREIGN PATENT DOCUMENTS

| | | | |
|---|---|---|---|
| 60-164346 | 8/1985 | Japan | 257/677 |
| 62-136059 | 6/1987 | Japan | 257/677 |
| 3-129870 | 6/1991 | Japan | 257/677 |

*Primary Examiner*—John Zimmerman
*Attorney, Agent, or Firm*—Richard D. Dixon

[57] ABSTRACT

An intermediate workpiece includes a first strip of laminated material exhibiting high thermal conductivity and which is subject to bowing in response to thermal cycling. A second strip of copper material is welded to the first strip along a longitudinal abutting edge of each strip. The first strip is partitioned into smaller heatspreader sections each for having a semiconductor die soldered thereto. Thermal manufacturing cycles will not cause a bowing of the second strip or of the heatspreader sections attached thereto.

20 Claims, 1 Drawing Sheet

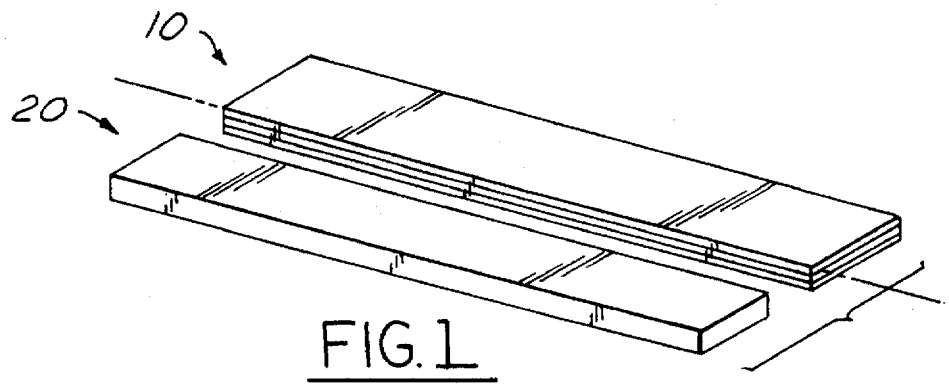
FIG. 1
FIG. 2
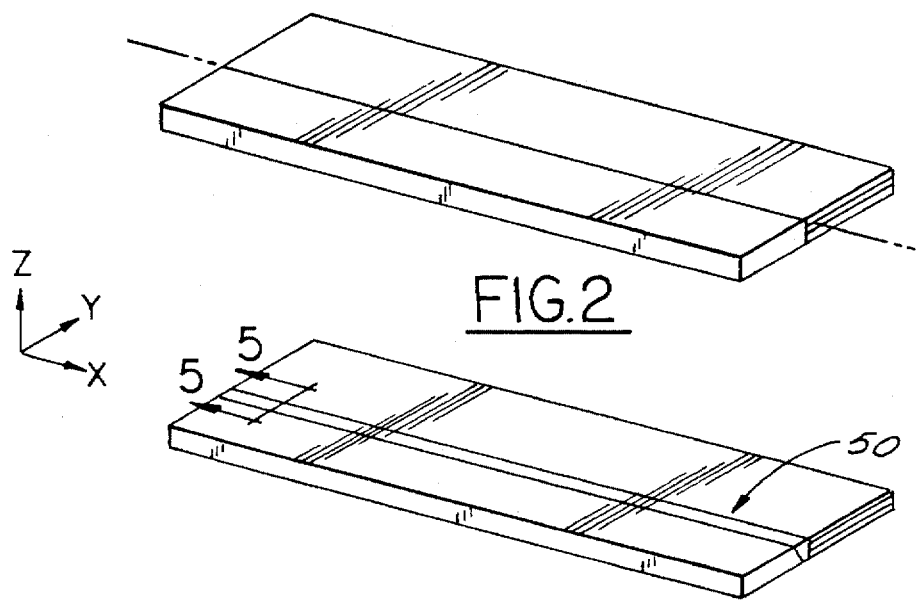
FIG. 3
FIG. 4
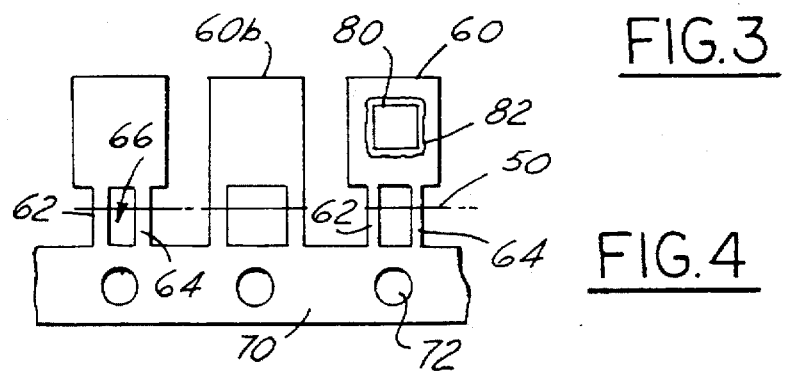
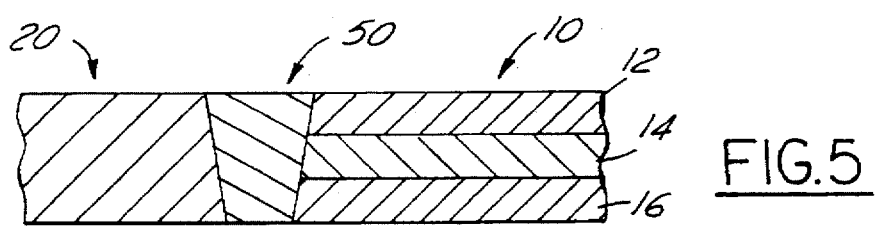
FIG. 5

HEATSPREADER CARRIER STRIP

BACKGROUND OF THE INVENTION

1. Field of the Invention

This invention relates to a composite substrate for carrying and dissipating heat from fragile articles, and more particularly, a combination carrier strip and heat spreader on which semiconductor die may be mounted with minimum thermal stress during production processing.

2. Description of the Prior Art

Semiconductor packages for power transistors and integrated circuits of the type used in ignition systems for automotive internal combustion engines are disclosed by Taruya et. al. in U.S. Pat. No. 5,288,667. Taruya utilizes a pre-molding strip 11 to hold the pins 3 in proper orientation with the leadframe 1 prior to forming the molded plastic package 5. Taruya explains that some leadframe sections are unnecessary because large portions of the material must be removed. Taruya also discloses the use of wire bonding strips 4 for coupling pads on the transistor or integrated circuit 2 to each of the pins 3. Newer automotive ignition system electronic systems utilize surface mount devices, instead of plastic packaged devices, in order to more efficiently dissipate the heat from the transistor.

Hynes et. al. in U.S. Pat. No. 4,320,412 discloses the use of a composite material, such as KOVAR 24, which is inlaid into a copper leadframe 10 for compensating for the difference in the coefficient of thermal expansion between a transistor 12 and the leadframe 10. As illustrated in FIG. 5, the KOVAR strips 14 may be mounted on opposing faces of the leadframe 10, with the transistor die 12 being mounted on one face. As explained by Hynes et. al. in column 1, the high thermal conductivity and coefficient of thermal expansion of the copper leadframe 10 are not a good match with the relatively lower coefficient of thermal expansion of the semiconductor material, typically silicon. After repeated thermal cycling, the silicon die mounted on the copper surface will break or malfunction as a result of the repeated thermally induced deformations.

As noted by Hynes in column 1, at lines 42 through 56, the use of relatively long lengths of these bi-metallic or layered composite materials result in a bowing or warping in the Z axis when subject to repeated thermal cycling. This bowing or warping will deform the semiconductor chip bonded to the heat spreader or carrier strip, which can result in breakage.

It is, therefore, an object of the present invention to provide a heat spreader of laminated material having a coefficient of thermal expansion that is relatively close to the coefficient of thermal expansion of the semiconductor chip to be mounted thereon. In order to avoid thermal warping along the entire length of this laminated material during the manufacturing process, a thermally stable carrier strip is provided as an integral part of the heatspreader. In order to reduce material costs and to provide a high degree of recycling capability for the materials used, the carrier strip is constructed of an inexpensive, recyclable material such as copper.

A primary advantage of the present invention is that the use of the expensive laminated material for carrying the semiconductor die can be minimized, while a less expensive, thermally stable and recyclable material such as copper, or copper-iron (2.5%), can be used for the carrier strip. This advantage obviates the expensive inlaying process described by Hynes in column 3 at lines 3 through 13.

SUMMARY OF THE INVENTION

This and other objectives are accomplished by providing an intermediate workpiece onto which are mounted a plurality of semiconductor die. The workpiece includes a first strip of material having a coefficient of thermal expansion approximately equal to that of the semiconductor die, and has a high coefficient of thermal conductivity. A second strip of material, that will not bow in response to thermal cycling, is aligned with and abutting the first strip of material, A longitudinal welded section joins abutting sections of the first and second strips substantially along the entire length thereof. The first strip of material is segmented into smaller heatspreader sections, each for receiving a semiconductor die attached thereto. In this manner, the thermal stresses involved in the manufacturing cycles will not cause significant deformations in either the second strip of material or in the heatspreader sections attached thereto.

BRIEF DESCRIPTION OF THE DRAWINGS

Other objects, features and advantages of the invention will be readily apparent from the following description of the preferred embodiment and drawings in which:

FIG. 1 is a perspective view of the strips of heatspreader and carrier materials.

FIG. 2 is a perspective view of the heatspreader and carrier strip materials in close abutment.

FIG. 3 is a perspective view of the heatspreader and carrier strip materials after being welded longitudinally along the abutment line.

FIG. 4 is a top plan view of multiple heatspreaders, each attached to the carrier strip.

FIG. 5 is a cross-sectioned view of the welded substrate material along section lines 5—5 in FIG. 4.

DETAILED DESCRIPTION OF THE PREFERRED EMBODIMENT

Referring now to FIG. 1, a long strip, approximately 8.5 inches long, ½ inch wide and 0.020 inches thick, of a composite material constructed by laminating together layers of copper, INVAR, and copper, is illustrated generally as reference numeral 10. While INVAR is described with respect to the preferred embodiment of this invention, other similar composite materials, such as copper laminated with aluminum nitride, beryllium oxide or boron nitride, and having suitable heat conduction and thermal coefficient of expansion characteristics similar to INVAR, may also be used. As used herein, INVAR refers to a low expansion iron alloy metal material having a nominal composition by weight of 36 percent nickel and the balance iron (otherwise denoted as Fe-36Ni). The various characteristics of INVAR and such materials, together with methods of manufacturing, are discussed in detail by, Jha, et. al., in U.S. Pat. No. 5,156,923, which is incorporated herein by reference. In the first preferred embodiment, the composite material comprising laminated strips of copper/INVAR/copper material 10 has a coefficient of thermal expansion of approximately 5.2 PPM per degree Centigrade. This coefficient of thermal expansion is between the coefficients of thermal expansion for a main substrate material and the semiconductor die for reducing the thermally induced stresses therebetween.

As illustrated in the right side of FIG. 5, the composite or laminated strip 10 is composed of sequential layers of copper 12, then INVAR 14, then copper 16. The strips are cold rolled under pressure so that the metallurgical bonds between the metal layers will be transformed to provide the required characteristics of thermal conductivity and coefficient of thermal expansion for the composite material. While FIG. 5 illustrates a single layer of INVAR 14 sandwiched between two layers of copper 12,16, it will be apparent to one skilled in the art that multiple layers of copper, INVAR, copper, INVAR, and copper may be joined in a composite material having the required characteristics. For clarity in the drawings and in this detailed description, the most simplified copper/INVAR/copper arrangement as illustrated in FIG. 5 will be utilized herein.

A second strip comprises a strip of copper material, approximately 8.5 inches long, ½ inch wide and 0.020 inches thick, is illustrated in FIG. 1 with the reference numeral 20. As used in the preferred embodiment, the term "copper" is construed broadly enough to include copper-iron (approximately 2.5%) and similar materials that are predominantly copper but which may include trace materials for providing other important characteristics. This copper material is less expensive than the copper/INVAR/copper material 10 by a factor of at least 20% to 30%. Therefore, while the more expensive copper/INVAR/copper material 10 should be used for the heatspreader, it is not necessary or even desirable for this material to be used for the carrier strip 20.

As shown in FIG. 2, the copper/INVAR/copper strip 10 and the copper carrier strip 20 are abutted, generally in a common plane, along adjacent longitudinal edges. In FIG. 3, the abutted sections of the copper carrier strip 20 and the composite material 10 have been welded together using a laser weld in order to create a single flat strip of material. The weld line 50, together with the phantom extension line, is shown as lines in FIG. 3 even though the actual demarcation between the composite strip 10 and the copper strip 20 may not be visible. With reference to FIG. 5, the weld 50 is shown as the central area 50 between the copper strip 20 and the matrix material strip 10. The laser weld 50 continues along the entire length so that each abutting section of the adjacent strips will be welded to the adjacent section. While laser welding has been described as the preferred method for welding the two strips together, one skilled in the art will recognize that other joining methods, such as resistance welding, friction welding, electron beam welding and mechanical compression/crimping may also be used as required by the particular application.

While FIGS. 1, 2, 3 and 5 illustrate that the composite strip 10 is generally of the same thickness as the copper strip 20, it will be apparent to one skilled in the art that different thickness for each of the strips can be used as required by the special circumstances.

Turning now to FIG. 4, the two strips of material, that is, the composite material 10 and the copper material 20 which have been welded together, are formed into a plurality of heatspreaders 60, and a single carrier strip or leadframe 70. The heatspreaders 60 are connected to the carrier strip 70 by two leads, shown generally as 62 and 64. While two leads have been illustrated in FIG. 4, it should be apparent that three or more leads may also be utilized as required by the circumstances of a particular situation. The adjacent leads 62 and 64 define a generally rectangular aperture 66. Leads 62 and 64 generally contain the welded section, shown as 50 in FIG. 3 and the phantom weld line 50 in FIG. 4. Therefore, it is apparent that none of the area originally defined by the copper strip 20 is contained within the area defined by the heatspreaders 60.

The exact shapes of each heatspreader 60, the leads 62 and 64, the aperture 66 and the alignment holes 72 in the carrier strip 70 may be optimized for the requirements of the particular application, and are formed by means of well-known punch and die stamping methods known in the metalworking arts. Further examples of these processes are described by Hynes et. al. in U.S. Pat. No. 4,320,412, which is incorporated herein by reference.

It should be noted again in FIG. 4 that the phantom weld line 50 intersects the leads 62 and 64, and does not communicate through the heatspreaders 60 or the carrier strip 70. Stated another way, the area defined by each heatspreader 60 is contained entirely within the original composite strip 10 shown in FIG. 1, and the area defined by the carrier strip 70 is contained entirely within the original copper strip 20. In this manner, the heatspreader 60 is composed of only the composite material 10, for which the thermal conduction and coefficient of thermal expansion are well known.

With continuing reference to FIG. 4, the resulting carrier strip 70, having the multiple heatspreaders 60 coupled thereon, is processed as a single unit. When heat is applied over the entire length of the carrier strip 70, the copper within the carrier strip 70 does not bow or deform in the Z axis direction. This should be contrasted with the Z axis deformation that would occur if the strip 20 were formed instead from a copper/INVAR/copper laminate, or other similar laminated composite materials, that tend to bow as a result of thermal cycling.

Typical manufacturing operations employing such a thermal cycling operation would be the attachment of a silicon die to the heatspreader shown in FIG. 4. First, the carrier strip 70 is withdrawn by a robotic mechanism from a cassette (not shown) in which multiple carrier strips are stored and moved between separate manufacturing operations. The carrier strip 70 is then heated sequentially in sections as it passes through an oven. As each heat spreader 60 is heated, solder 82 is deposited on the face of the heatspreader 60. After the solder melts, a transistor or other silicon die 80 is tightly pressed against the solder 82 and the heatspreader 60 in order to assure adequate thermal conductivity. Next, the heat is removed from the heatspreader 60, thereby allowing the solder 82 to cool and solidify.

This thermal manufacturing process step will not cause the carrier strip 70 to warp or bend in the Z-axis direction because it is constructed of a solid strip of copper material. While the composite material forming the heatspreader 60 may tend to bow or deform slightly during the temperature cycling process, the relatively small size of the heatspreader 60 will limit the deformation to very small amounts in the Z-axis direction. The silicon die 80 can easily withstand such repetitive temperature cycling processes, and will not be damaged by the small deformation of the heatspreader 60.

On the other hand, a relatively large deformation in the Z-axis direction of the carrier strip 70, especially when multiple carrier strips are stacked within a processing cassette, would jam the automated mechanism from loading and unloading the carrier strips 70 from the cassette. In high volume production environments where millions of these heatspreaders are processed each year, such equipment malfunctions due to preventable jams must be avoided in order to provide maximum up-time and minimum unproductive down-time.

In addition to the foregoing advantages, this construction will allow the copper carrier strip 70 and associated scrap materials to be recycled for subsequent use. Since copper in these quantities is an expensive intermediate production material, this cost savings can be substantial over the long term.

Furthermore, while the use of a standard size and thickness of copper for the carrier strip 70 allows for the use of industry standard, high speed cassette handling and processing equipment, the use of a separate material for the first strip 10 allows for the flexible substitution of different materials, different shapes and sizes, and different thicknesses for the resulting heatspreaders 60 without changing the material handling systems. Finally, the location and structural rigidity of the welded section 50 within the resulting leads 62 and 64 provides additional strength and rigidity when automated die cutting, soldering and shearing equipment are used to process the distended heat spreaders 60 when they are still attached to the carrier strip 70.

After the semiconductor die 80 is soldered to the heatspreader 60, the carrier strip 70 then can be loaded into other automated processing equipment for cutting the heatspreaders 60 from the carrier strip 70. While in some applications it may be desirable to leave extended sections of the leads 62 and 64 for use in coupling to other components or the printed circuit board, in the present application it is desirable to truncate the leads 62 and 64 generally even with the rectangular outline of the heatspreader 60. In this manner, the generally rectangular heatspreader 60 may then be soldered directly to a corresponding space on an underlying circuit substrate (not shown) so that the heat from the silicon die 80 may be transferred directly through the heatspreader 60 and into the circuit substrate for cooling the semiconductor component. Of course, well-known wire bonding techniques and equipment can be used to connect power as well as input and output signals to the silicon die 80.

In an alternate embodiment, the leads 62 and 64, rather than being inset from the corresponding edges of the heatspreader 60 is as illustrated in FIG. 4, would have an outside edge generally aligned with a corresponding outside edge of the heatspreader 60b. This arrangement of the leads provides for an improved resistance against any torque induced, and improves the edge uniformity produced during, the cutting and shearing processes.

While the preferred embodiment of the present invention has been described herein, it will understood by one skilled in the art that various modifications, changes, enhancements and improvements which deviate from the written description in the drawings contained herein may be adopted without departing from the spirit and scope of the present invention in the following claims.

We claim:

1. An intermediate workpiece onto which are mounted a plurality of semiconductor die, comprising:

a first strip of material formed from laminated strips of copper, a core material and copper, said first strip of material having a high coefficient of thermal conductivity and having a known coefficient of thermal expansion similar to that of the semiconductor die, a second strip of material, aligned with and abutting said first strip of material, that will not bow in response to thermal cycling, a longitudinal weld section joining abutting sections of said first and second strips of material substantially along the entire length thereof, and with said first strip of material segmented into smaller heatspreader sections, each for receiving a semiconductor die attached thereto, whereby thermal manufacturing cycles will not cause significant deformations in either said second strip of material or said heatspreader sections attached thereto.

2. The intermediate workpiece described in claim 1 wherein said first strip of material comprises alternating strips of copper, Fe-36Ni and copper.

3. The intermediate workpiece described in claim 2 wherein said second strip of material comprises a strip of copper.

4. The intermediate workpiece described in claim 1 wherein segments of said longitudinal weld section are contained within lead sections coupling between each of said heatspreaders and said second strip of material.

5. The intermediate workpiece described in claim 1 wherein said longitudinal weld section comprises a laser weld between said first and second strips of material.

6. The intermediate workpiece described in claim 5 wherein said second strip of material comprises a carrier strip, attached to each of said heatspreader sections by at least two elongated leads, with each of said leads containing a segment of said longitudinal weld section therein.

7. The intermediate workpiece described in claim 1 wherein said core material is selected from the group consisting of aluminum nitride, beryllium oxide and boron nitride.

8. An intermediate workpiece onto which are mounted a plurality of semiconductor die, comprising:

a strip of laminated material including copper, a core material and copper, said strip of laminated material having a coefficient of thermal expansion in known relationship to that of the semiconductor die, said strip of laminated material being subject to bowing in response to thermal cycling, a strip of solid material having a longitudinal edge welded to an abutting longitudinal edge of said strip of laminated material, with said strip of laminated material being partitioned into smaller heatspreader sections each for receiving and being thermally coupled with a semiconductor die, whereby thermal manufacturing cycles will not cause bowing of said solid strip of material or said heatspreader sections connected thereto.

9. The intermediate workpiece as described in claim 8 wherein said strip of laminated material comprises laminated strips of copper, Fe-36Ni and copper.

10. The intermediate workpiece as described in claim 9 wherein said strip of solid material comprises copper.

11. The intermediate workpiece described in claim 8 wherein said core material is selected from the group consisting of aluminum nitride, beryllium oxide and boron nitride.

12. An intermediate workpiece onto which are mounted a plurality of semiconductor die, comprising:

a strip of laminated material including copper, a core material and copper, said strip of laminated material having a coefficient of thermal expansion in known relationship to that of the semiconductor die, a strip of copper having a longitudinal edge juxtaposed with and welded to an abutting longitudinal edge of said strip of laminated material, with said strip of laminated material being partitioned into smaller heatspreader sections, each for receiving and being thermally coupled with a semiconductor die attached thereto, whereby thermal manufacturing cycles will not cause bowing of said strip of copper.

13. The intermediate workpiece described in claim 12 wherein said strip of copper comprises a carrier strip, attached to each of said heatspreader sections by at least two elongated leads each containing a segment of said longitudinal weld therein.

14. The intermediate workpiece described in claim 13 wherein said longitudinal weld comprises a laser weld between parallel edges of said strip of laminated material and said strip of copper.

15. The intermediate workpiece as described in claim 14 wherein said strip of laminated material comprises strips of copper, Fe-36Ni and copper.

16. The intermediate workpiece described in claim 12 wherein said core material is selected from the group consisting of aluminum nitride, beryllium oxide and boron nitride.

17. The intermediate workpiece described in claim 12, wherein welded sections of said strip of copper and said strip of laminated material are contained within lead sections defined between each of said heatspreaders and said strip of copper.

18. An intermediate workpiece for carrying semiconductor die, comprising:

a first strip of material formed from laminated strips of copper, a core material and copper, said first strip of material having a high coefficient of thermal conductivity and having a known coefficient of thermal expansion, a second strip of material, aligned with and abutting said first strip of material, that will not bow in response to thermal cycling, a longitudinal weld section joining abutting sections of said first and second strips of material substantially along the entire length thereof, and with said first strip of material being segmented into smaller heatspreader sections, each attached to said second strip of material by at least two leads, with each of said leads containing a segment of said longitudinal weld section therein.

19. The intermediate workpiece described in claim 18 wherein said core material is selected from the group consisting of Fe-36Ni, aluminum nitride, beryllium oxide and boron nitride.

20. The intermediate workpiece described in claim 18 wherein said second strip of material comprises a strip of copper.

* * * * *